(12) United States Patent
Miller et al.

(10) Patent No.: US 6,538,798 B2
(45) Date of Patent: Mar. 25, 2003

(54) PROCESS FOR FABRICATING STICTION CONTROL BUMPS ON OPTICAL MEMBRANE VIA CONFORMAL COATING OF ETCH HOLES

(75) Inventors: Michael F. Miller, Hollis, NH (US); Martin A. Schmidt, Reading, MA (US)

(73) Assignee: Axsun Technologies, Inc., Billerica, MA (US)

( * ) Notice: Subject to any disclaimer, the term of this patent is extended or adjusted under 35 U.S.C. 154(b) by 0 days.

(21) Appl. No.: 09/734,471

(22) Filed: Dec. 11, 2000

(65) Prior Publication Data

US 2002/0071170 A1 Jun. 13, 2002

(51) Int. Cl.⁷ .............................................. G02B 26/00
(52) U.S. Cl. ...................... 359/291; 359/247; 359/578; 359/577
(58) Field of Search ................................. 359/290, 291, 359/292, 295, 578, 577, 846, 247; 438/97, 48, 50, 712; 257/417

(56) References Cited

U.S. PATENT DOCUMENTS

| 5,459,610 A | 10/1995 | Bloom et al. ................ 359/572 |
| 5,751,469 A | * 5/1998 | Arney et al. ................. 359/291 |
| 6,307,169 B1 | * 10/2001 | Sun et al. .................... 200/181 |
| 6,452,712 B2 | * 9/2002 | Atobe et al. ................. 359/291 |

OTHER PUBLICATIONS

Gui, C.; Veldhuis, G.J.; Koster, T.M.; Lambeck, P.V.; Berenschot, J.W.; Gardeniers, J.G.E.; and Elwenspoek, M., "Nanomechanical Optical Devices Fabricated With Aligned Wafer Bonding," MESA Research Institute, University of Twente, The Netherlands. 1998 IEEE (482–487).

* cited by examiner

Primary Examiner—Hung Xuan Dang
Assistant Examiner—Tuyen Tra
(74) Attorney, Agent, or Firm—J. Grant Houston

(57) ABSTRACT

An electrostatically driven optical membrane comprises a support structure and a membrane structure separated from the support structure by an electrostatic cavity. Stiction plugs are formed in the membrane structure. The plugs extend from a surface of the membrane. In one implementation, the plugs are hollow to allow a subsequent release process in which the sacrificial layer is removed.

25 Claims, 5 Drawing Sheets

PROCESS FOR FABRICATING STICTION CONTROL BUMPS ON OPTICAL MEMBRANE VIA CONFORMAL COATING OF ETCH HOLES

BACKGROUND OF THE INVENTION

Micro-optical electromechanical system (MEOMS) membranes are used in a spectrum of optical applications. For example, they can be coated to be reflective and then paired with a stationary mirror to form a tunable Fabry-Perot (FP) cavity/filter. They can also be used as stand-alone reflective components to define the end of a laser cavity, for example.

The MEOMS membranes are typically produced by depositing a membrane structure over a sacrificial layer, which has been deposited on a support structure. This sacrificial layer is subsequently etched away or otherwise removed to produce a suspended membrane structure in a release process. Often the membrane layer is a silicon compound and the sacrificial layer can be polyimide, for example.

Typically, membrane deflection is achieved by applying a voltage between the membrane and a fixed electrode on the support structure. Electrostatic attraction moves the membrane in the direction of the fixed electrode as a function of the applied voltage. This results in changes in the reflector separation of the FP filter or cavity length in the case of a laser.

SUMMARY OF THE INVENTION

One chronic problem associated with micro electromechanical system (MEMS) membranes in general is stiction. Specifically, if deflected sufficiently to contact an adjoining surface, the membranes can adhere to that surface because of atomic-level forces. This problem can be more intractable in the context of the optical membranes of MOEMS devices since anti-stiction coatings may be incompatible with the required optical coatings, such as antireflective (AR) coatings or dielectric highly reflecting (HR) coatings, for example. Moreover, these membranes are typically smooth because of the focus on optical performance, which smoothness typically increases the level of stiction forces in the event of contact.

In general, according to one aspect, the invention features an electrostatically driven optical membrane. It comprises a support structure and a membrane structure, which separated from the support structure by an electrostatic cavity. Stiction plugs are formed in the membrane structure. The plugs extend from a surface of the membrane. In one implementation, the plugs are hollow to allow a subsequent release process in which the sacrificial layer is removed.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1:
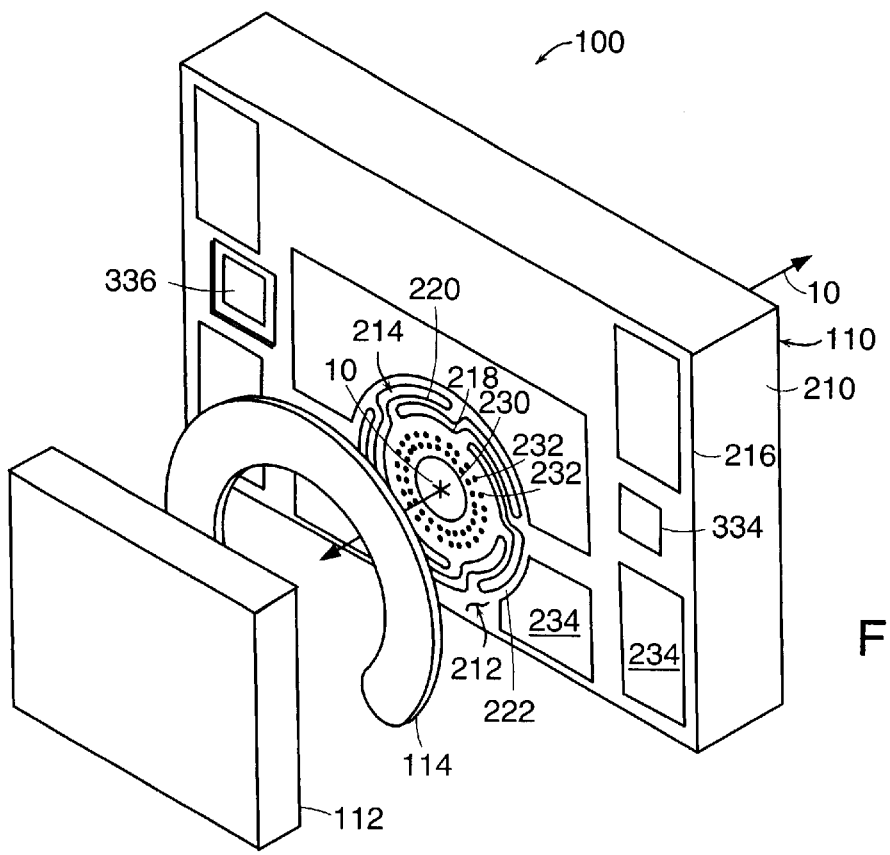
FIG. 1 is a perspective, exploded view of a tunable filter comprising an optical membrane device, according to the present invention.

FIG. 1 shows a Fabry-Perot (FP) tunable filter 100 comprising an optical membrane device 110 to which the principles of the present invention are applicable in one example.

Generally, in the FP filter device 100, a spacer device 114 separates the lens device 112 from the membrane structure 110 to thereby define a Fabry-Perot (FP) cavity.

The optical membrane device 110 comprises handle material 210. Preferably, the handle material is wafer material such as from a silicon handle wafer, which has been subsequently singulated into the illustrated device. The handle wafer material is between 100 and 1,000 micrometers thick. In the preferred embodiment, it is between 300 and 500 micrometers in thickness.

An optical membrane layer 212 is added to the handle wafer material 210. The membrane structure 214 is formed in this optical membrane layer 212. This optical membrane layer is between 5 and 10 micrometers in thickness. Preferably, it is between 6 and 8 micrometers in thickness.

An insulating layer 216 separates the optical membrane layer 212 from the handle wafer material 210 and further defines an electrostatic cavity between the membrane and the electrode of the handle wafer. During manufacture, this insulating layer functions as a sacrificial layer, which is partially removed to release the membrane structure 214 from the handle wafer material 210. In the preferred embodiment, this insulating layer is between 3 and 6 micrometers in thickness. In the current embodiment, it is greater than 3.5 micrometers in thickness, but less than 5 micrometers, nominally 4 micrometers +/–5%.

Currently, the membrane layer 212 is silicon. The membrane layer is manufactured from a silicon wafer that has been bonded to the insulating layer under elevated heat and pressure. Other alternatives are, however, silicon nitride, polycrystalline silicon, or essentially single crystal silicon, which have been deposited on the insulating layer.

In the current embodiment, the membrane structure 214 comprises a body portion 218. The optical axis 10 of the device 100 passes concentrically through this body portion 218 and orthogonal to a plane defined by the membrane layer 212. A diameter of this body portion 218 is preferably 300 to 600 micrometers, currently it is about 500 micrometers.

Tethers 220 extend radially from the body portion 218 to an outer portion 222, which comprises the ring where the tethers 220 terminate. In the current embodiment, a spiral tether pattern is used.

An optical coating dot 230 is typically deposited on the body portion 218 of the membrane structure 214. In the implementation as a Fabry-Perot filter or other reflecting membrane, the optical dot 230 is preferably a highly reflecting (HR) dielectric mirror stack. This yields a highly reflecting, but low absorption, structure that is desirable in, for example, the manufacture of high finesse Fabry-Perot filters.

In the illustrated embodiment, artifacts of the manufacture of the membrane structure 214 are etchant holes 232. These holes allow an etchant to pass through the body portion 218 of the membrane structure 214 to assist in the removal of the insulating layer 216 during the release process.

According to the invention, stiction plugs are formed in the membrane structure 214. The plugs are preferably formed in the etchant holes 232. These stiction plugs extend from a surface of the membrane structure, at least in the direction of the handle wafer material 210. They are preferably hollow.

In the illustrated embodiment, metal pads 234 are deposited on the proximal side of the membrane device 210. These are used to solder bond, for example, the spacing structure 114 onto the proximal face of the membrane device 110. Of course, it could be avoided if the spacing structure 214 is formed to be integral with the membrane device 110. Bond pads 234 are also useful when installing the filter 100 on a micro-optical bench, for example. Also provided are a membrane layer wire bond pad 334 and a handle wafer wire bond pad 336. The membrane layer bond pad is a wire bonding location for electrical control of the membrane layer. The handle wafer bond pad 336 is a wire bond pad for electrical access to the handle wafer material.

Figure 2:
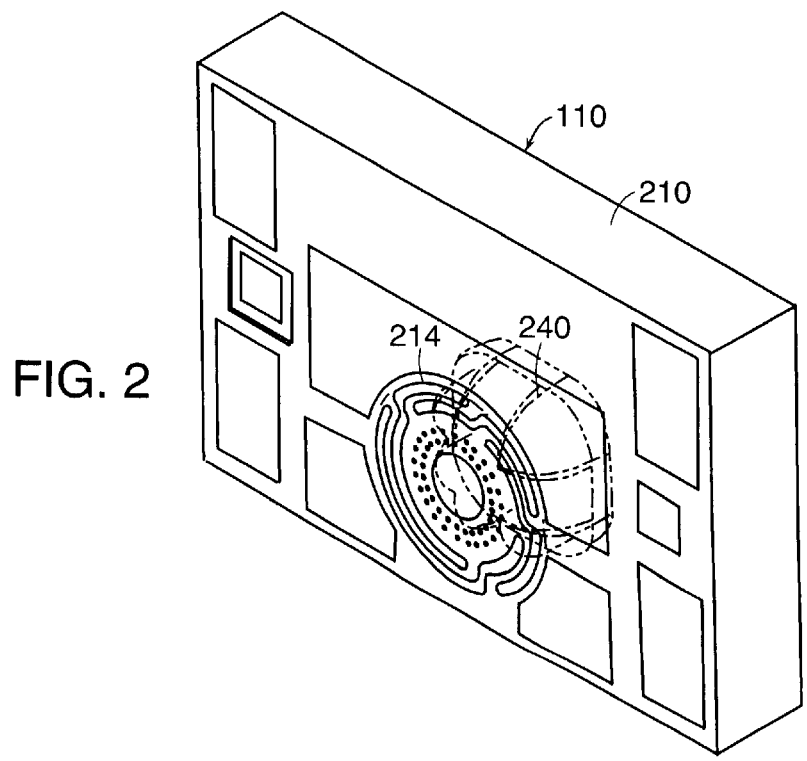
FIG. 2 is a perspective view of the inventive optical membrane device 110 showing the backside optical port 240, in phantom.

As illustrated in FIG. 2, an optical port 240 (shown in phantom) is provided, in some embodiments, extending from a distal side of the handle wafer material 210 to the membrane structure 214. Whether or not this optical port 214 is required depends upon the transmissivity of the handle wafer material 210 at the optical wavelengths over which the membrane structure 110 must operate. Typically, with no port, the handle wafer material along the optical axis must be AR coated.

Figure 3:
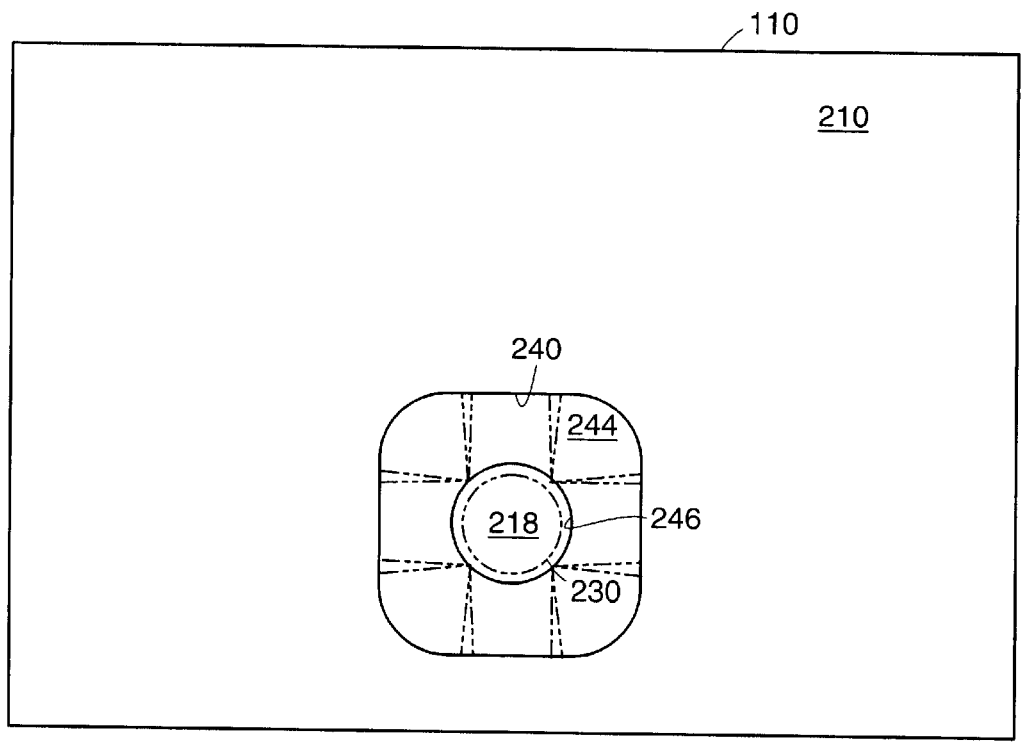
FIG. 3 is an elevation view of the distal side of the inventive optical membrane device showing the optical port.

FIG. 3 further shows the optical port 240 formed through the distal side of the handle wafer material 210 in the optical membrane device 110. Specifically, the optical port 240 has generally inward sloping sidewalls 244 that end in the port opening 246. As a result, looking through the distal side of the handle wafer material, the body portion 218 of the membrane structure can be observed and is preferably concentric with the optical coating 230.

FIGS. 4A through 4I illustrate a process for fabricating a membrane device according to the present invention.

Figure 4A:
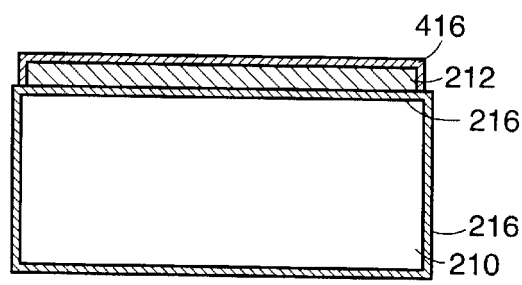
FIGS. 4A through 4I are schematic partial cross-sectional views illustrating a process for fabricating a membrane device according to the present invention.

Referring to FIG. 4A, the process begins with a support or handle wafer 210, which in one embodiment is a standard n-type doped silicon wafer. The handle wafer 210 is 75 mm to 150 mm in diameter, for example.

The wafer 210 is oxidized to form the sacrificial insulating layer 216. The sacrificial insulating layer 216 defines the electrostatic cavity length. Design rules for electrostatic cavities typically dictate that the membrane can only be deflected across approximately one-third of the cavity length. Larger deflections can result in snap down, where the membrane moves in an uncontrolled fashion to contact the stationary electrostatic electrode. Further, for typical wavelength division multiplexing (WDM) and dense WDM (DWDM) applications, such membranes need to be deflectable by at least one-half of an operational wavelength of the tunable filter. For C and L band DWDM systems, such membranes need to deflect at least (0.5) 1620 nanometers (nm). These principles yield cavity length designs of approximately of 2,5 $\mu$m and longer.

Presently, the preferred embodiment uses an oxide thickness of 3.5 $\mu$m or greater. To yield reasonable operating voltages, however, the layer is preferably less than 6 $\mu$m in thickness. Currently, the layer is less than 5 $\mu$m, about 4 $\mu$m +/−5%.

The membrane layer 212 is then installed on the sacrificial insulating layer 216. Preferably, the membrane layer 212 is 6 to 10 $\mu$m in thickness. Such thickness range provides adequate structural integrally while not making the structure overly rigid or brittle.

In one embodiment, the membrane layer is a deposited polycrystalline layer. A low-pressure chemical vapor deposition process is used in one implementation. During deposition, typically a dopant, such as n-type, is added to improve conductivity while controlling the crystallinity and density of the polysilicon. Alternatively, other material systems are applicable such as silicon nitride, for example.

In a current process, a membrane wafer such as a doped silicon wafer is bonded to the oxide layer using elevated temperature and pressure. This process yields a highly crystalline membrane structure with the associated advantages. Preferably, the wafer material has less than $10^9$ dislocations per square centimeter.

After deposition or bonding, the membrane layer 212 is annealed and polished back to the desired membrane thickness, if necessary. A thin oxide layer 416 is preferably then grown on the membrane layer 414 to function as an etch protection layer.

Figure 4B:
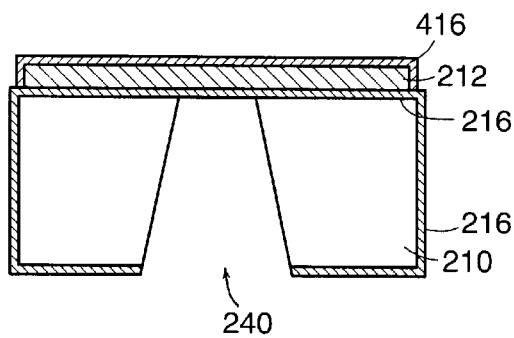

As shown in FIG. 4B, preferably the optical port 240 is patterned and etched into the handle or support wafer 210 in a backside etch process, preferably using a combination of isotropic and anisotropic etching. The sacrificial insulating layer 216 is used as an etch stop.

Figure 4C:
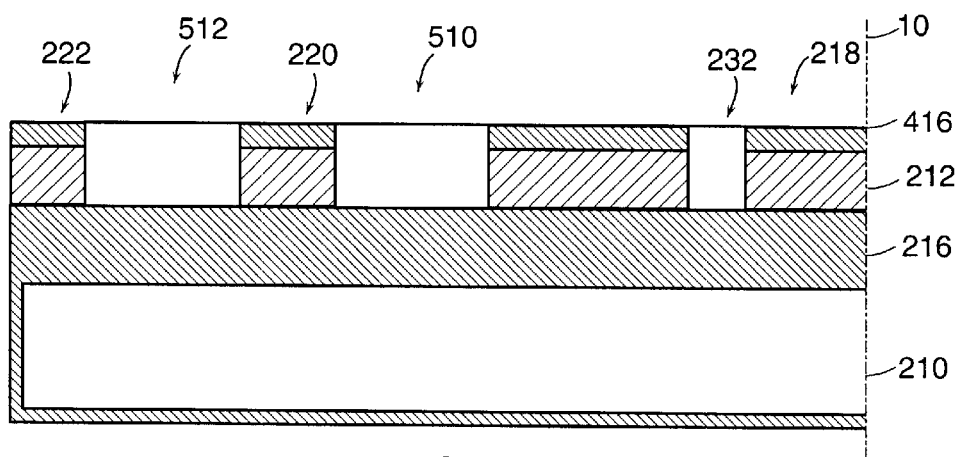

FIG. 4C is a partial cross-sectional view taken through the membrane and handle layers illustrating the process for manufacturing the anti-stiction plugs in the membrane structure according to the present invention.

Specifically, it illustrates the patterning of the membrane layer 212 to begin the formation of the membrane structure. Specifically, HF holes 232 are formed through the membrane structure down to the depth of the insulating layer 216. Further, the tethers 220 are defined by the formation of holes 510 and 512.

Figure 4D:
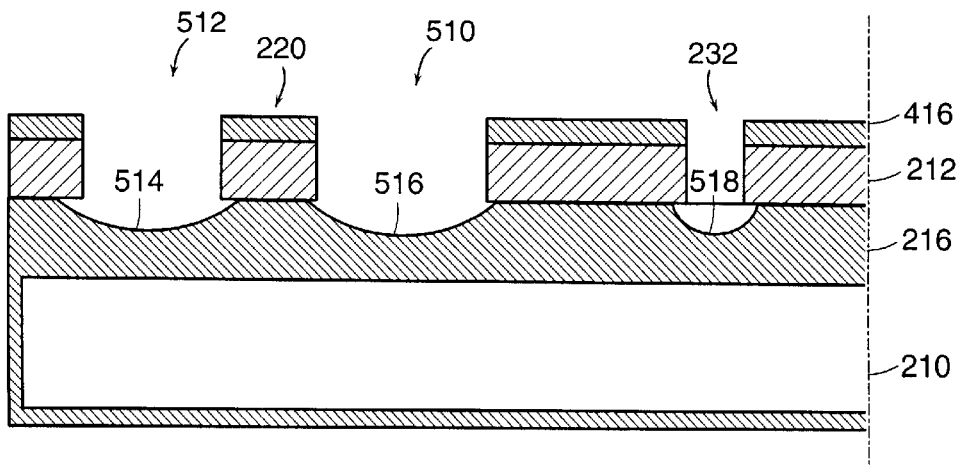

As illustrated in FIG. 4D, a timed etch of the exposed oxide insulating layer 216 is performed to yield depressed regions 514, 516 and 518. According to the invention, it is depressed region 518 that is most relevant for the operation of the present invention. Preferably, there is some undercut of the membrane layer 212.

In one embodiment, the oxide etch is a wet, isotropic etch of oxide layer 216 in buffered hydrofluoric acid.

Alternatively, other holes in the membrane could be formed, which holes are dedicated to receiving the stiction plugs. The advantage with using the HF holes is that they are already present and a dense hole pattern could affect the membrane's structural integrity and/or stiffness, for example. The disadvantage is that hollow plugs are required to enable the subsequent release process. If other holes are used, the HF holes are preferably filled or etched after the stiction bump process is complete.

Figure 4E:
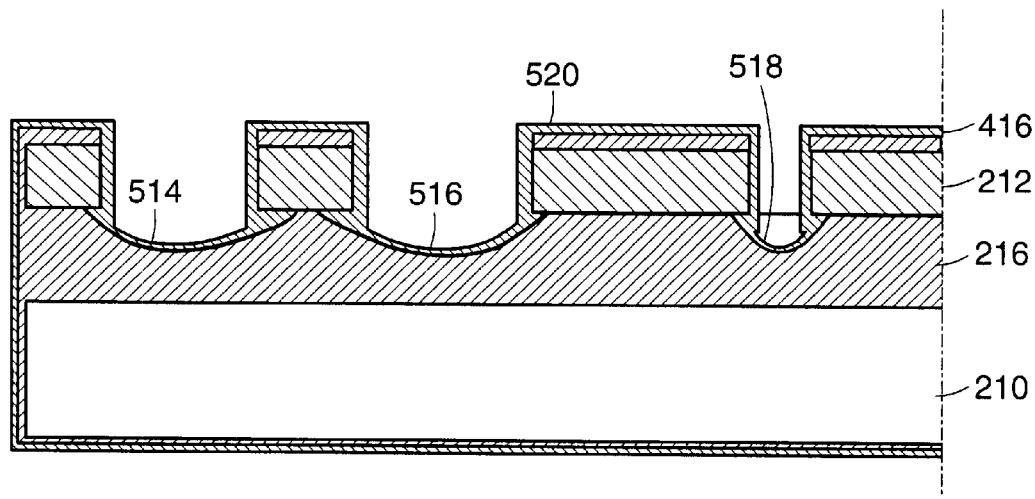

Next, as illustrated in FIG. 4E, a deposition, preferably conformal, is then performed. In the preferred embodiment, a polysilicon film 520 is deposited over the entire surface of the structure. Because of its conformal nature, it fully coats the depressed regions, 514, 516, and 518 and extends into any undercut. In the preferred embodiment, this polysilicon layer is deposited to a depth of preferably less than about 1 micrometer. The thickness of the deposited layer corresponds approximately to the height of the bumps with 0.3 to 1.0 μm being typical. Presently, it is about 0.5 micrometers thick. This conformal layer forms over the exposed silicon and oxide areas.

Epitaxially formed layers are also possible. If selective epitaxial growth is performed, the silicon layer will only form on exposed silicon areas and not on the exposed oxide regions. If such a process is used, it is not necessary to etch away the silicon at the bottom of the HF release holes as described later.

In still other embodiments, other conformal deposition processes are used, such as silicon nitride. Generally, the deposited material must be resistant to the subsequent release process, however.

In one embodiment, the deposited material is selected or doped, in the case of the poly silicon to be conductive. Thus, in the event of a snap-down event, charge between the membrane and the handle wafer, for example, is dissipated, allowing the membrane to return to its neutral position. In other embodiments, the deposited material is undoped or an insulator such as silicon nitride. In such case, electronic circuitry is additional provided to detect the snap down condition and dissipate the charge across the cavity before bonding or plug damage occurs.

Figure 4F:
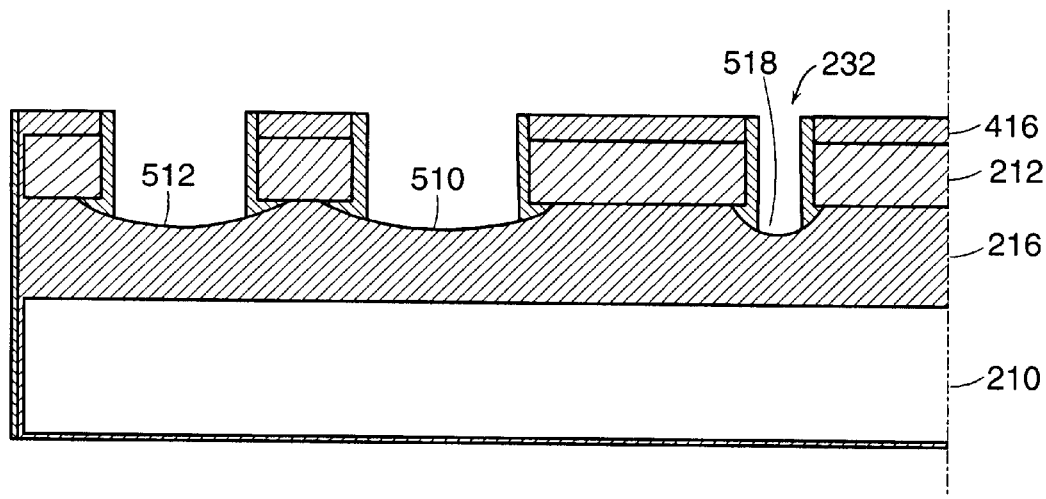

As illustrated in FIG. 4F, the backside polysilicon film is removed and then polysilicon is removed from the exposed horizontal surfaces using an anisotropic silicon etch such as a dry etch, e.g., deep RME or RME. This results in the polysilicon film being left in the undercut regions and on the sidewalls of holes 510 and 512. Importantly, the side walls of the HF hole are also coated, with polysilicon extending into the depressed region 518 and into any undercut regions.

In the embodiment where the plugs are deposited in dedicated holes, this etch can be avoided or a simple polishing step used.

Figure 4G:
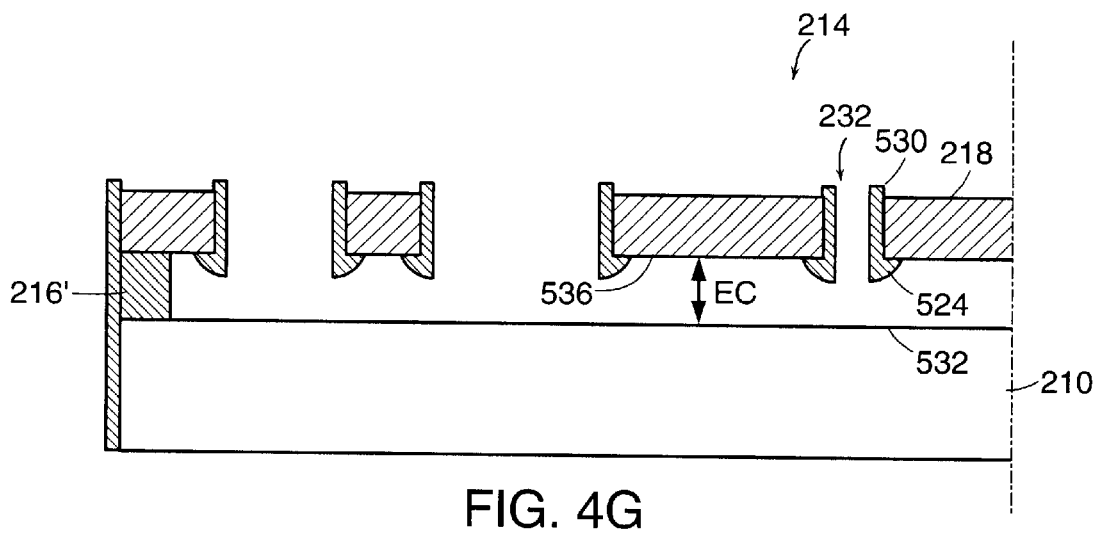

As illustrated in FIG. 4G, during the subsequent release step in which the insulating layer 216 is etched from underneath the membrane structure to thereby release the membrane structure, hollow polysilicon stiction plugs 530 remain in the HF release hole 232. Thus, if the membrane structure 214 and specifically, the body portion 218 comes in contact with the proximal surface of the handle wafer 532, the portion of the stiction plug 524 that extend beyond the inner surface of the membrane inner surface 536 of the membrane structure 214 contacts the proximal surface 532 of the handle wafer 210. The small contact area prevents stiction attachment of the membrane structure to the handle wafer in the case of an over voltage, for example, being generated in the electrostatic cavity EC.

Figure 4H:
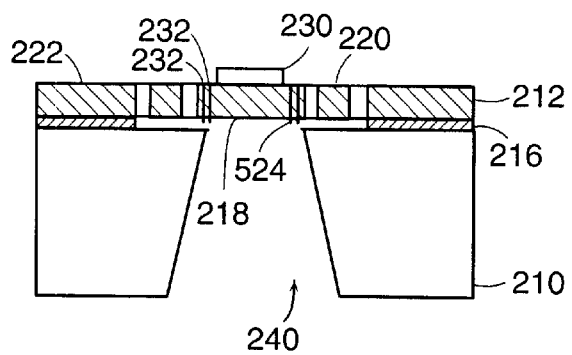

FIG. 4H shows the installation of the highly reflective (HR) spot 230. Specifically, the HR spot 230 is formed by depositing and etching-back using a patterned photoresist layer. The HR coating is preferably a multi-layer coating of 4 more layers, preferably 8 or more, with a 16 dielectric layer mirror being used in the current embodiment. The preferred method of etching the dielectric coatings 230 is to use a dry etch process, such as reactive ion etching and reactive ion milling.

Also shown is the formation membrane structure including the tethers 220, membrane body 218 and outer portion 222 in the membrane layer 212. Specifically, a photoresist layer is deposited and patterned with the membrane structure pattern. It also functions to protect the HR spot, in one implementation. Thereafter, the release process is performed in which an etchant is used to remove the insulation layer 212 from underneath the membrane structure.

Figure 4I:
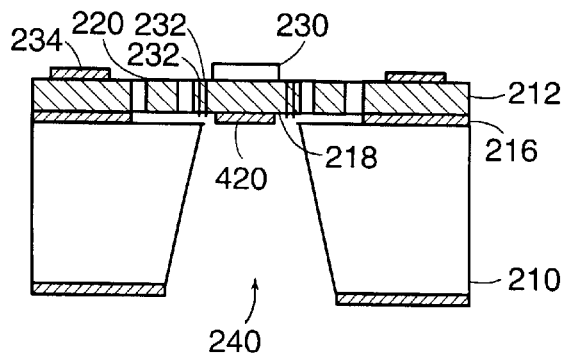

Finally as shown in FIG. 4I, an anti-reflection (AR) coating 420 is deposited through the optical port 240 onto the exterior surface of the membrane. Further, metal pad 234 are added.

While this invention has been particularly shown and described with references to preferred embodiments thereof, it will be understood by those skilled in the art that various changes in form and details may be made therein without departing from the scope of the invention encompassed by the appended claims.

What is claimed is:

1. A process for fabricating stiction features on an electrostatically driven optical membrane, the process comprising:

forming holes in a membrane material layer;

performing a partial etch of a sacrificial layer under the membrane after forming the holes to thereby form depressed regions in the sacrificial layer; and performing a deposition through the holes and into the depressed regions to form elevated regions around the holes relative to a surface of the membrane to thereby reduce a risk of stiction adhesion of the membrane to an opposed surface across an electrostatic cavity.

2. A process as claimed in claim 1, wherein step of forming the holes in the membrane material layer comprises forming the holes completely through the membrane material layer.

3. A process as claimed in claim 1, further comprising releasing the membrane by removing a sacrificial layer from underneath the membrane material layer.

4. A process as claimed in claim 1, further comprising performing a membrane release process by allowing an etchant to attack a sacrificial layer under the membrane through the holes.

5. A process as claimed in claim 1, further comprising performing a membrane release process by allowing hydrofluoric acid to attack a sacrificial layer under the membrane through the holes.

6. A process as claimed in claim 1, further comprising performing a membrane release process by allowing an etchant to attack a sacrificial layer under the membrane through the holes after a step of coating the holes.

7. A process for fabricating a membrane for an optical filter device having stiction control features, the process comprising providing support material;

forming a sacrificial layer on the support material;

providing a membrane layer on the sacrificial layer;

patterning the membrane layer to form a membrane structure including forming holes in the membrane layer and tethers between a body portion of the membrane structure and an outer portion of the membrane structure;

coating the holes to form elevated regions around the holes; and removing at least part of the sacrificial layer to release the membrane structure.

8. A process as claimed in claim 7, wherein sacrificial layer is silicon oxide.

9. A process as claimed in claim 7, wherein the membrane layer is a wafer material is that is bonded to the sacrificial layer.

10. A process as claimed in claim 7, further comprising etching an optical port from a backside of the support material to a depth of the sacrificial layer.

11. A process as claimed in claim 7, wherein the support material is a semiconductor wafer.

12. A process as claimed in claim 7, wherein step of forming the holes in the membrane material layer comprises forming the holes completely through the membrane material layer.

13. A process as claimed in claim 7, wherein the step of removing the sacrificial layer comprises etching the sacrificial layer under the membrane through the coated holes.

14. A process as claimed in claim 7, wherein the step of removing the sacrificial layer comprises etching the sacrificial layer under the membrane through the coated holes with hydrofluoric acid.

15. A process as claimed in claim 7, wherein step of coating the holes comprises a conformal deposition process.

16. A process as claimed in claim 7, wherein step of coating the holes comprises a conformal polysilicon deposition process.

17. A process for fabricating a membrane for an optical filter device having stiction control features, the process comprising providing support material;

forming a sacrificial layer on the support material;

providing a membrane layer on the sacrificial layer;

patterning the membrane layer to form a membrane structure including forming holes in membrane layer;

performing a partial etch of the sacrificial layer under the membrane structure after the step of forming the holes to thereby form depressed regions in the sacrificial layer;

performing a deposition through the holes and into the depressed regions to form elevated regions around the holes; and removing at least part of the sacrificial layer to release the membrane structure.

18. An electrostatically driven optical membrane, comprising:

a support structure a membrane structure separated from the support structure by an electrostatic cavity; and stiction plugs that are located in holes in the membrane structure.

19. An electrostatically driven optical membrane as claimed in claim 18, wherein the stiction plugs extend from a surface of the membrane structure.

20. An electrostatically driven optical membrane as claimed in claim 18, wherein the stiction plugs comprise polysilicon.

21. An electrostatically driven optical membrane as claimed in claim 18, wherein the stiction plugs are deposited in a conformal deposition process.

22. An electrostatically driven optical membrane as claimed in claim 18, wherein the stiction plugs are conductive.

23. An electrostatically driven optical membrane as claimed in claim 18, wherein the stiction plugs are insulative.

24. An electrostatically driven optical membrane, comprising:

a support structure a membrane structure separated from the support structure by an electrostatic cavity; and stiction plugs in the membrane structure; wherein the stiction plugs are hollow.

25. An electrostatically driven optical membrane, comprising:

a support structure a membrane structure separated from the support structure by an electrostatic cavity; and multiple stiction plugs in the membrane structure, which are arranged around an optical axis of the membrane structure; wherein the stiction plugs extend through holes from an upper surface of the membrane structure into the electrostatic cavity in a direction of the support structure.

* * * * *